United States Patent [19]

Tuckerman

[11] Patent Number: 4,992,847
[45] Date of Patent: Feb. 12, 1991

[54] THIN-FILM CHIP-TO-SUBSTRATE INTERCONNECT AND METHODS FOR MAKING SAME

[75] Inventor: David B. Tuckerman, Livermore, Calif.

[73] Assignee: Regents of the University of California, Oakland, Calif.

[21] Appl. No.: 202,296

[22] Filed: Jun. 6, 1988

[51] Int. Cl.$^5$ .................. H01L 29/04; H01L 27/04
[52] U.S. Cl. ............................ 357/68; 357/65; 357/56; 357/55; 357/75
[58] Field of Search ............... 357/67, 55, 56, 75

[56] References Cited

U.S. PATENT DOCUMENTS

| | | | |
|---|---|---|---|
| 4,054,895 | 10/1977 | Han | 437/84 |
| 4,067,100 | 1/1978 | Kojima et al. | 437/187 |
| 4,286,374 | 9/1981 | Hantusch | 437/187 |
| 4,297,653 | 10/1981 | Scifres et al. | 357/19 |
| 4,356,056 | 10/1982 | Cornette et al. | 437/194 |
| 4,459,166 | 7/1984 | Dietz et al. | 357/67 R |
| 4,500,905 | 2/1985 | Shibata | 357/56 |
| 4,670,770 | 6/1987 | Tai | 357/60 |
| 4,718,070 | 1/1988 | Liau et al. | 357/17 |
| 4,839,714 | 6/1989 | Doehler et al. | 357/67 |
| 4,866,500 | 9/1989 | Nishizawa et al. | 357/56 |
| 4,893,166 | 1/1990 | Geekie | 357/56 |

FOREIGN PATENT DOCUMENTS 0056372  4/1983  Japan ........................ 351/17

Primary Examiner—Andrew J. James
Assistant Examiner—Viet Q. Nguyen
Attorney, Agent, or Firm—Henry P. Sartorio

[57] ABSTRACT

Integrated circuit chips are electrically connected to a silica wafer interconnection substrate. Thin film wiring is fabricated down bevelled edges of the chips. A subtractive wire fabrication method uses a series of masks and etching steps to form wires in a metal layer. An additive method direct laser writes or deposits very thin metal lines which can then be plated up to form wires. A quasi-additive or subtractive/additive method forms a pattern of trenches to expose a metal surface which can nucleate subsequent electrolytic deposition of wires. Low inductance interconnections on a 25 micron pitch (1600 wires on a 1 cm square chip) can be produced. The thin film hybrid interconnect eliminates solder joints or welds, and minimizes the levels of metallization. Advantages include good electrical properties, very high wiring density, excellent backside contact, compactness, and high thermal and mechanical reliability.

10 Claims, 4 Drawing Sheets

THIN-FILM CHIP-TO-SUBSTRATE INTERCONNECT AND METHODS FOR MAKING SAME

BACKGROUND OF THE INVENTION

The United States Government has rights in this invention pursuant to Contract No. W-7405-ENG-48 between the U.S. Department of Energy and the University of California, for the operation of Lawrence Livermore National Laboratory.

The invention relates generally to integrated circuit fabrication, and more particularly to the interconnection of chips mounted on a substrate and methods of forming the interconnects.

One problem in manufacturing hybrid wafer scale integration (HWSI) circuits is making interconnections between the various chips after they have been attached to a common substrate. The speed and compactness of modern electronic systems containing many integrated circuit (IC) chips are often compromised by the methods used to package and interconnect these chips. Ideally, chip-to-chip interconnects should have very high density (e.g. at least 1000 connections on a 1-cm square chip) but very low inductance, capacitance, and resistance. Multi-layer ceramic (MLC) interconnection modules, onto which many unpackaged IC chips can be mounted, partly address these needs but are limited and expensive. The manufacturing processes limit the minimum geometry of MLC interconnects to rather coarse dimensions (about 250 $\mu$m pitch). Thus, a very large number of metal layers (as many as 33) is required to provide dense interconnect, power distribution and crosstalk isolation. Other difficulties include thermal expansion mismatch ($4 \times 10^{-6}$/°C. difference between Si and alumina), high dielectric constant (about 9.4 for alumina) with consequent low signal propagation speeds, and substantial thermal resistance of the relatively thick ceramic (typically 2 cm$^2$-°C./W).

To overcome limitations and expense of MLC technology for high-performance systems, silicon wafers can be used as substrates for thin-film interconnection modules. These silicon PC boards (SiPCBs) can provide very precise, high-density interconnects with a minimal number (3 or 4) of metal levels. With sufficient metallization thickness (about 5 $\mu$m), transmission-line quality interconnects are achievable over wafer-scale distances (about 20 cm). SiPCBs have outstanding thermal and mechanical characteristics; compact liquid-cooled versions can dissipate a heat flux of more than 1000 W/cm$^2$, and they are virtually immune to thermal stresses, owing to the thermal expansion match between the chips and the board.

In order to physically attach and then electrically connect IC chips to a silicon wafer, three standard techniques have been successfully adapted from ceramic hybrid technology: flip-chip solder-bump reflow, wire bonding, and tape-automated bonding (TAB). All use macroscopic solder joints or welds to make the electrical connections between chip and module, which are ultimately subject to fatigue failures induced by thermal cycling. An interconnect method which provides low inductance, high interconnection density, high reliability and backside bonding (for heat conduction) is desired; however, none of the prior art methods provide a combination of all these characteristics. Flip-chip technology can provide a fairly dense array of low-inductance ($<0.1$ nH) interconnects, but has poor heat transfer (elaborate measures are required to dissipate even a 20 W/cm$^2$ heat flux), and requires extra metallization levels for routing to bond pads and for metallurgical reasons. Electrical contact to the back side of the substrate is poor or nonexistent, which is a problem for certain technologies such as power devices or radiation-hardened CMOS. In contrast, wire-bonding and TAB both permit the chip back side to be rigidly attached to a substrate, which enables much better thermal and electrical contact to the interconnection module. However, both have enough inductance ($>2$ nH for typical 2.5-mm long bonds) to cause problems in ultra-high speed digital or microwave applications, and both are limited in density.

Thus, chip-to-board interconnection technology appears to be a weak point in terms of electrical performance and mechanical reliability of silicon hybrid WSI technology. A thin-film interconnection technique might provide substantially greater interconnect density (e.g., at least a 50 $\mu$m pitch and preferably a 25 $\mu$m pitch), with excellent electrical properties (impedance-matched transmission lines, if desired), while enhancing the reliability of the connections by replacing the solder/weld joints with standard thin-film contacts.

SUMMARY OF THE INVENTION

Accordingly, it is an object of the invention to provide a chip interconnect method and structure for electrically connecting one or more chips to an interconnection substrate on which they are mounted.

It is also an object of the invention to provide a chip interconnect method and structure which provides low inductance, high interconnection density and backside bonding.

It is another object of the invention to provide a chip interconnect method and structure which eliminates macroscopic solder joints and welds, in order to enhance reliability.

It is a further object of the invention to provide a chip interconnect method and structure for use in manufacturing hybrid wafer-scale integrated circuits.

It is also an object of the invention to provide a thin film interconnection method and structure between integrated circuit chips.

It is another object of the invention to provide an interconnection density of at least 1000 connections on a 1-cm square chip.

It is a further object of the invention to provide interconnections on a 25 micron pitch.

It is also an object of the invention to minimize the levels of interconnect.

The invention is an interconnection method and structure in which thin film wires are patterned down the bevelled edges of silicon chips using laser etching (pantography) techniques. The technology features very high interconnect densities (e.g., a 25 $\mu$m, pitch), excellent electrical properties, very dense packing of chips, and a face up mounting scheme for optimizing heat transfer, electrical contact and mechanical integrity. This approach reaps many of the benefits of wafer scale integration (compactness, reliability, speed and economy) while retaining a hybrid circuit approach for design flexibility and manufacturability.

A substrate wafer (such as silicon) is patterned and etched to leave rectangular "mesas" at the locations where chips are to be bonded, and further processed to form interconnections, to form a silicon PC board. IC chips are then bonded to the mesas by a thin film joint. The edge of the chip is ground away, typically at an angle of 60° from the horizontal (although other angles such as 90°, i.e. vertical, or even greater are also feasible), including a portion of the mesa to expose a thin smooth flush joint at the chip/mesa interface. Alternatively, the chips may be bonded to the substrate without any mesas. Wires are then fabricated down the chip edges by a variety of methods.

The wafer and chips are coated with a $SiO_2$ layer followed by an amorphous silicon (a-Si) layer. The a-Si is then locally etched by a laser and the etched pattern is transferred to the underlying $SiO_2$ by an etching process such as reactive ion etching (RIE) to form vias. The a-Si mask is then plasma stripped. The wafer is metallized, e.g. with gold (over a barrier layer), then overcoated with $SiO_2$ and then a-Si. The a-Si/$SiO_2$ laminate is then laser etched and reactive ion etched as previously described to generate an inorganic mask for the metallization. The laser beam focus is maintained at all points on the chip edge by translating the objective lens mount along its optic axis under computer control. The $SiO_2$ pattern is transferred to the gold by ion milling to remove metal and produce wires, completing the chip-to-board interconnect procedure.

As an alternative to ion milling, metal may be electroplated up through a $SiO_2$ mask which has been etched where wires are desired. The $SiO_2$ mask exposes areas of a thin underlying metal layer which acts as a nucleation site. The $SiO_2$ would then be stripped and the initial coating of metal would be stripped to electrically isolate the electroplated wires. This process combines substractive and additive processes.

Yet another alternative is a direct-write all-additive method for forming the wires down the chip edges. Thin metal wires (e.g., tungsten or nickel) are first laser deposited down chip edges to the wafer by direct laser writing in a suitable gaseous environment. Additional metal is then electrolessly plated onto the laser deposited wires to increase wire size and reduce resistance. Such a process might be particularly useful for repairs.

The invention provides a thin-film hybrid interconnect technology with advantageous electrical properties, very high wiring density, excellent backside thermal and electrical contact to the substrate, compactness, and high reliability under thermal and mechanical stresses. The interconnect electrical properties include low capacitance and low inductance. For CMOS circuits, low capacitance interconnects might eliminate the need for large power intensive high current output drivers. For ECL or GaAs circuits low inductance permits propagation of signals with very fast risetimes. For all circuit families, the very high wiring density (greater than 1,000 wires/chip) allows the use of every other wire as a ground or power wire in a coplanar waveguide geometry, providing exceedingly low crosstalk between signal lines, as well as a very low impedance power distribution scheme. High wiring density also makes it feasible to design new IC's with as many inputs and outputs as desired without increasing the number of metallization layers on the IC. Compact, faceup, thin film bonding enables fabrication of large arrays of CCD imagers. The ability to remove high heat fluxes is important for computer applications.

DETAILED DESCRIPTION OF THE PREFERRED EMBODIMENTS

Figure 1A:
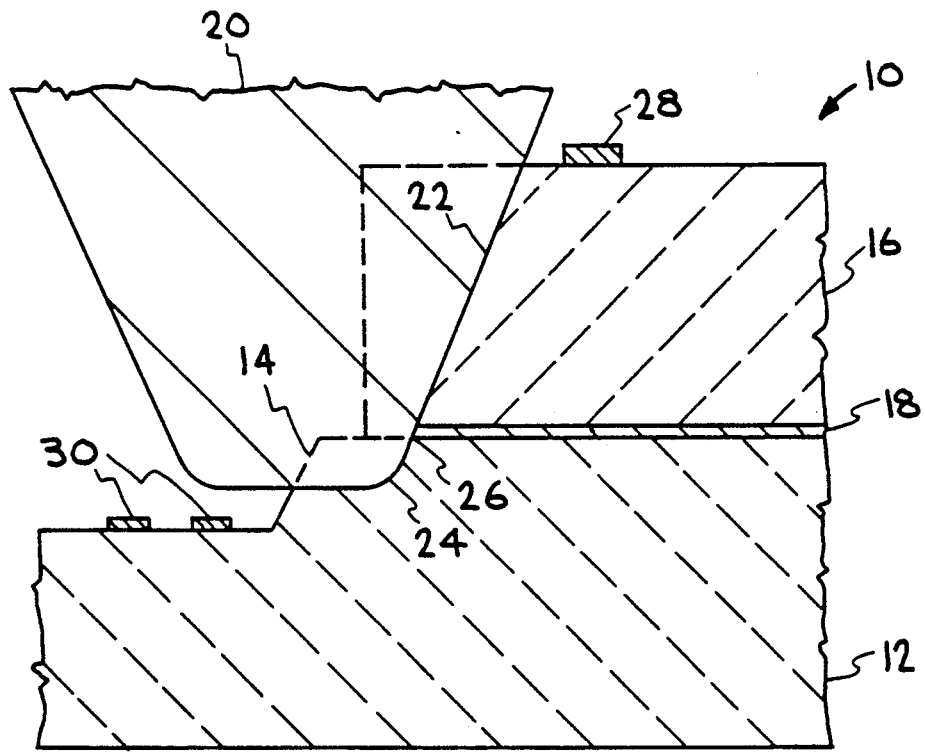
FIG. 1A is a cross-section of a portion of a hybrid circuit at an intermediate stage of fabrication showing an integrated circuit chip joined to a mesa atop an interconnection substrate and the formation of a bevelled edge on the chip and portion of the mesa by microgrinding.

FIG. 1A illustrates a portion of a circuit 10 at an intermediate stage of the fabrication procedure. A <100> silicon wafer 12 is patterned and etched, e.g. in KOH, to leave rectangular "mesas" 14 (typically 50 to 75 microns high, with bevelled edges) at the locations where chips are to be bonded, and further processed to form a silicon PC board, e.g. by formation of thin film contacts or interconnects 30. Pre-tested IC chips 16 are then bonded (on their back sides) to the mesas by a thin-film joint 18 which should preferably be free from large (>10 μm) voids at the edge and electrically conductive. The joint should be able to withstand subsequent moderate temperature processes such as plasma enhanced chemical vapor deposition (e.g. T=250° C.). The Au-Si eutectic system (alloy) ($T_{eutectic}$=363° C.) is a suitable bond metallurgy (it has been widely used in industry as a thick-film die attach). In contrast to industry practice, gold alloy preforms are not used in the invention, as they would produce an excessively thick joint (typically about 25 μm). A joint thickness of approximately 3 μm, or more generally 1–10 μm, is normally produced, about the minimum acceptable for chips which have not been specially lapped to enhance flatness.

Figure 1B:
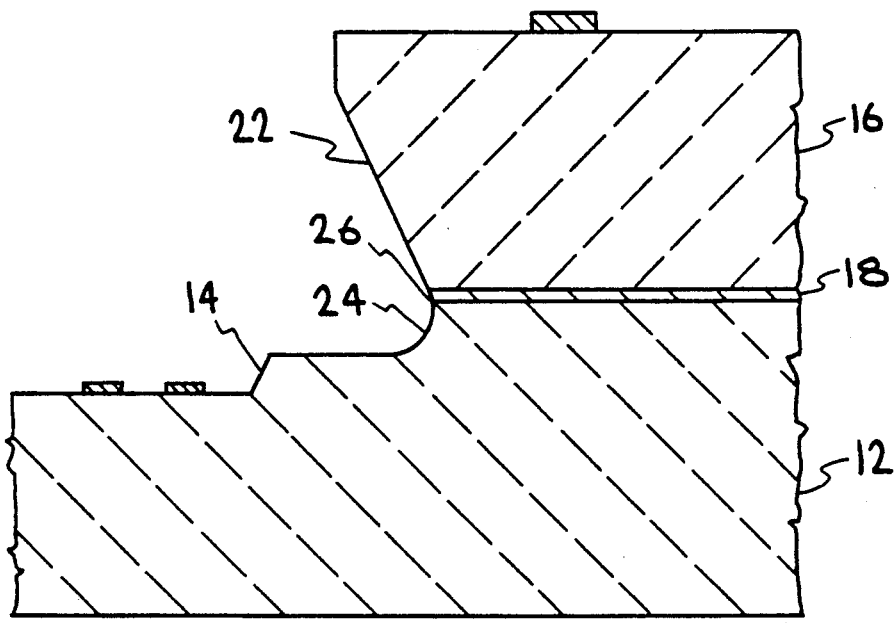
FIG. 1B illustrates a chip cut at a reentrant angle beyond vertical.

A microgrinder (a computer-controlled dicing saw with a bevelled blade) having a cross section 20 as shown is used to bevel the edge 22 of the chip, typically at an angle of 60° from the horizontal; it also removes a portion 24 of the mesa to expose a thin, smooth (<1 μm roughness), flush joint 26 at the chip/mesa interface. If the chip kerf width is too small to permit 60° beveling, then steeper bevel angles such as 75° may be used; even patterning vertical edges has been achieved. For very space-critical applications where no material can be removed from the top of the chip, it is possible to grind the chip at a reentrant angle (beyond vertical), as shown in FIG. 1B. Thin film wires can now be formed from bond pads or electrical contacts 28 on the chip 16 to contacts or interconnects 30 on wafer 12.

Figure 2A:
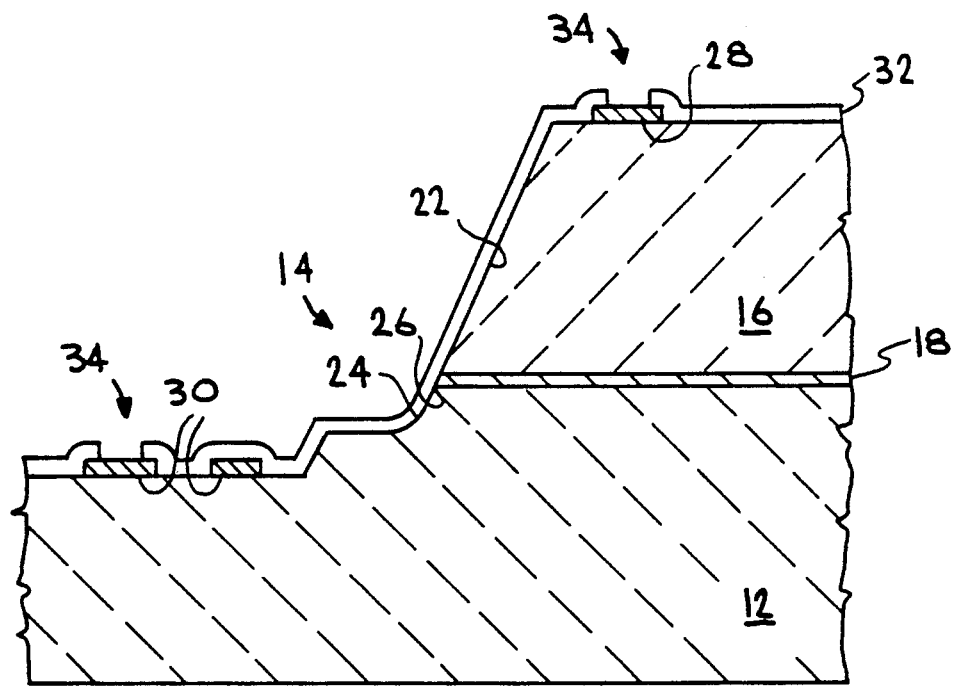
FIGS. 2A,B are cross-sections of a portion of a hybrid circuit at a further stage of fabrication, showing a dielectric layer and metal layer or wire, respectively, formed on the chip and substrate.
Figure 2B:
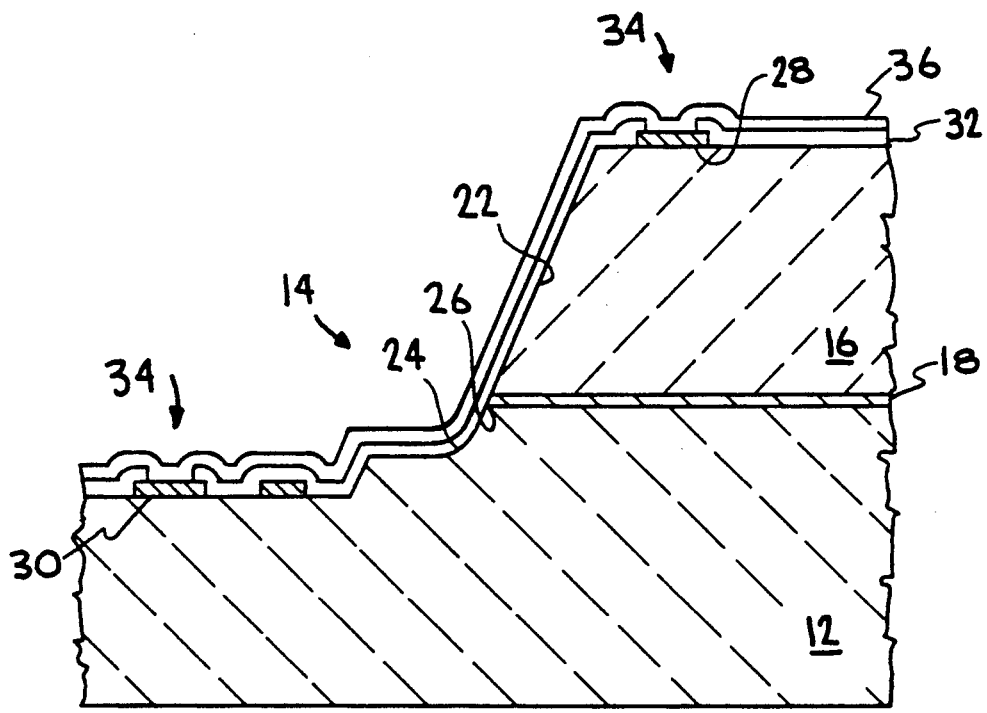

As shown in FIG. 2A a dielectric layer ($SiO_2$) 32 is formed on the chip 16 and substrate 12. Vias 34 are formed in dielectric layer 32 at desired locations. e.g. at chip contact 28 and substrate interconnect 30 to allow electrical interconnections. As shown in FIG. 2B, a metal layer or metal wire (Au) 36 is formed on the dielectric layer 32, making electrical contacts through vias 34.

The edge 22 of chip 16 as well as a portion 24 of mesa 14 is ground away, at a suitable angle, so that a flush joint at the chip-substrate bond 18 is produced. Mesas 14 are formed on the substrate 12 to facilitate the formation of this joint. However, in some cases the mesas may be unnecessary and the chips 16 can be mounted directly on the surface of substrate 12. The chip edge and chip substrate bond can then be ground away to produce the desired flush joint. Although the invention is described with reference to silicon chips mounted on a silicon wafer, other materials can be used, e.g. GaAs chips on a germanium substrate.

Figure 3:
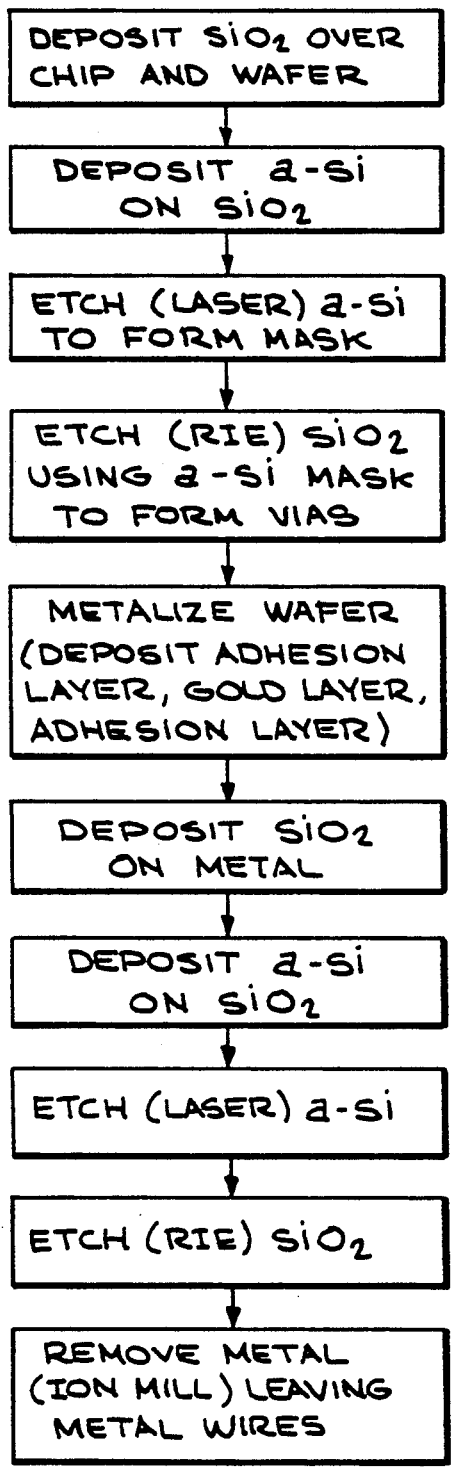
FIG. 3 is a flow chart of a subtractive process for forming metal wires down a chip edge for chip-to-wafer interconnect.

A subtractive process, illustrated in the flow chart of FIG. 3, forms the metal wires by a series of deposition and etching steps. Typically, vias or holes for the wires to connect to electrical contacts on the chip or wafer are first formed on the wafer and bevelled chips; otherwise the process can start with the metallization step described below. The wafer with bevelled chips is cleaned and overcoated with a dielectric, e.g. approximately 3 $\mu$m of $SiO_2$, using plasma-enhanced chemical vapor deposition (PECVD). The $SiO_2$ is coated with an inorganic mask, e.g. amorphous silicon (a-Si) using PECVD. Carbon could also be used as a mask. The a-Si is then locally etched, preferably by a laser, e.g. by irradiating it in a 760-torr chlorine gas ambient with a computer-controlled argon-ion laser beam, acousto-optically scanned at 3 mm/sec and 300 mW power, focused to a 5-micron spot diameter. The etched pattern is transferred to the underlying $SiO_2$ by a suitable etching process such as reactive-ion etching (RIE), plasma etching or wet chemical etching, forming vias down to all the chip bond pads, to all points on the wafer which electrically connect to the chip bond pads, and to the chip/mesa joint if good electrical contact to the back side of the chip is needed. The a-Si mask is then plasma-stripped.

The wafer is metallized, e.g. with approximately 3 $\mu$m of gold (over a barrier or adhesion layer, e.g. Ti:W), then overcoated with PECVD-deposited $SiO_2$ and then a-Si or C. The a-Si/$SiO_2$ laminate is then laser etched and reactive-ion-etched or otherwise processed as described above, to generate an inorganic mask for the metallization (to remove all the metal except for the desired wires). The laser beam focus is maintained at all points on the chip edge by translating the objective lens mount along its optic axis, under computer control. The choice of a "subtractive" laser process which etches an a-Si mask, rather than an "additive" process such as pyrolytic nickel or tungsten deposition, is motivated by the relatively slow deposition rates of the additive processes, coupled with their sensitivity to surface conditions (nucleation, thermal conductivity, and reflectivity). The laser beam focus is maintained on the chip edge using a computer controlled objective lens mount. The $SiO_2$ pattern is transferred to the gold by ion milling or other etching techniques such as electropolishing, removing all metal from undesired areas and leaving the metal wires, completing the chip-to-board interconnect procedure.

In the chip interconnect process a subtractive process as described can be used to fabricate wires on the chips attached to a wafer. However, the subtractive process is a complex process. First, a plurality of layers of different materials are sequentially deposited on the edge of the chip and substrate. To form gold wires, the following sequence of layers is deposited: Ti:W-Au-Ti:W-$SiO_2$-Si(amorphous), with Si being the last (top) layer. The thin titanium tungsten layers are used as adhesion layers for the gold. The amorphous silicon layer is used to form a mask for the $SiO_2$ and the $SiO_2$ is used to form a mask for the gold. After depositing all the layers, the silicon is laser etched to form a mask. The $SiO_2$/Ti:W is then reactive ion etched (RIE) using the silicon as a mask. The gold layer is then ion milled (preferably in $O_2$ to etch stop at the Ti:W) to form gold wires.

There are a number of problems with the subtractive process. If the chip-to-substrate joint is of poor quality, gold can get trapped in the crevices and not be removed in the ion milling operation, causing short circuits. Furthermore, it is necessary to prevent metal from covering the active areas of the silicon PC board (the transmission lines which connect the chips) since the presence of an upper metal plane would adversely affect the electrical properties (characteristic impedance) of the transmission lines. This would require a shadow mask or a photolithography step. In addition, the process is slow, particularly because of the ion mill step.

Figure 4:
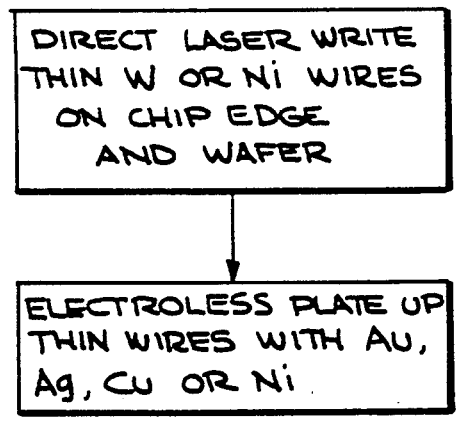
FIG. 4 is a flow chart of an additive process for forming metal wires down a chip edge for chip-to-wafer interconnect.

The invention includes an additive process, shown in the flow chart of FIG. 4, for fabrication of wires up the edges of chips by laser deposition. Tungsten or nickel wires are laser deposited on the chip edges. This is a direct write process in which the chip surface or wafer is heated by a laser beam while surrounded by a tungsten hexafluoride or nickel carbonyl atmosphere. Once these tungsten or nickel wires have been produced, the wire size can be increased and the resistance reduced to desired levels by plating up metal on the thin wires. The plating process would be electroless, utilizing metals such as gold, silver, copper, or nickel.

Clearly, the additive process is much simpler than the subtractive process. The additive process should have much higher through-put because it eliminates the ion mill step which is often the rate limiting step of the subtractive process There would also be no possibility of radiation damage from ion milling. It would be impossible to have short circuits between neighboring conductors (although open circuits might occur). No shadow mask or photolithography step is required since the metal is placed only where the laser writes it. Finally, it would be possible to write down vertical edges (using an angled objective lens) which is not possible in the subtractive process because the reactive ion etch step (for $SiO_2$) operates at normal incidence to the wafer, and sputter deposition of metals is difficult on vertical surfaces. Thus, the additive process should be much simpler to carry out and may produce a higher yield.

The additive process, while simpler, has certain limitations. The laser deposition processes require highly toxic gases such as $Ni(CO)_4$ or $WF_6$. Moreover the direct writing processes require that the surface be coated with an absorbing layer such as a-Si, and are sensitive to nucleation and adhesion problems. The laser processes are not fast enough, typically less than 10 mm/sec, for many commercial applications. Finally, electroless plating processes are in many situations less desirable than electroplating processes.

Accordingly, the invention also includes a quasi-additive or subtractive/additive process for forming metal lines using laser or other patterning for chip-to-substrate interconnect. According to the invention, the areas where metal is desired are defined by laser or otherwise etching a pattern in a mask layer to expose a metal surface which is then used to nucleate subsequent electroplating or electroless plating to form a metal line of desired size.

Figure 5A:
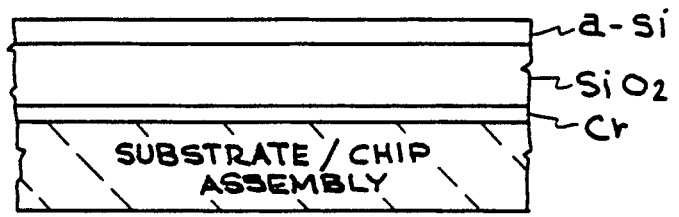
FIGS. 5A–F illustrate the steps of a quasiadditive or subtractive/additive process for forming metal wires down a chip edge for chip-to-wafer interconnect.
Figure 5B:
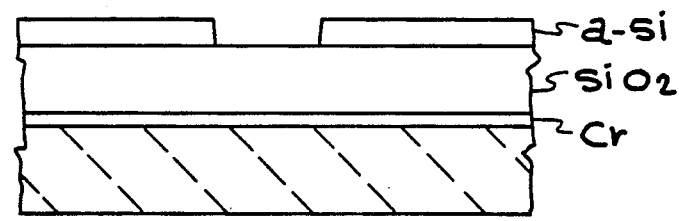
Figure 5C:
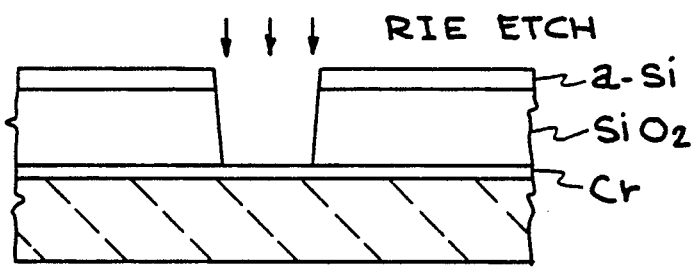
Figure 5D:
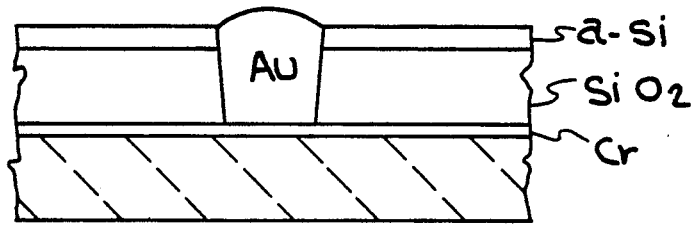
Figure 5E:
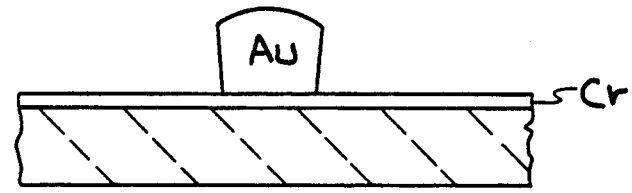
Figure 5F:
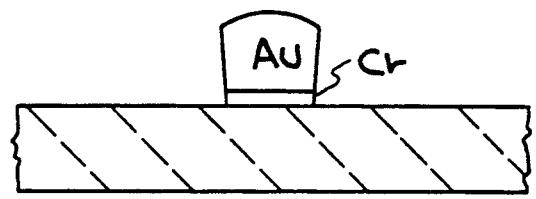

An illustrative specific sequence which could be used for chip-to-substrate interconnect is shown in FIGS. 5A–F. In the first step, as shown in FIG. 5A, a series of layers, Cr (or other suitable metal), $SiO_2$, a-Si, are sequentially formed on the substrate/chip assembly. Other metals, e.g. Cu, Au, Ti, as well as other dielectric and mask materials could be used. In step two, as shown in FIG. 5B, the a-Si layer is laser etched in a $Cl_2$ ambient; the laser etch process is a relatively fast process. In the third step, shown in FIG. 5C, the laser etched a-Si layer is used as a mask to wet chemical etch, plasma etch or reactive ion etch (RIE) the $SiO_2$ layer, using the Cr layer as an etch stop. Thus, a trench is formed down to the Cr layer which corresponds to the desired metal line position. In step four, as shown in FIG. 5D, a metal wire is built up using electroless or electroplating with the exposed Cr at the bottom of the trench serving as a nucleation site. Typically gold or copper lines can be formed. In step five, as shown in FIG. 5E, once the metal wire has been built up to its desired height, the surrounding a-Si and $SiO_2$ layers are plasma etched away, leaving a metal line standing on the Cr layer. In the sixth and final step, shown in FIG. 5F, the exposed Cr layer surrounding the metal line is etched away leaving a freestanding metal line formed on the substrate.

Figure 6:
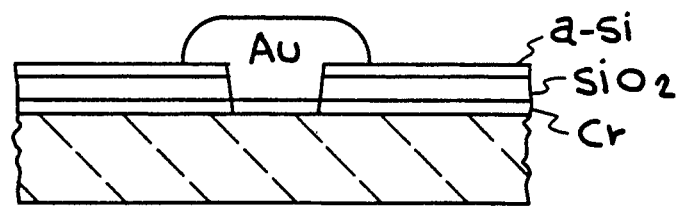
FIG. 6 illustrates the shape of wire formed by the process of FIGS. 5A–F using a thin $Si/SiO_2$ layer.

If the shape of the metal cross-section is important, i.e., the vertical side must be relatively smooth as for long distance transmission line interconnects, the Si/$SiO_2$ layer must be as thick as the desired line so that the line is conformal, as shown in FIG. 5D. If, however, the shape of the cross-section is unimportant, e.g. short lengths such as up a chip edge, a much thinner Si/$SiO_2$ layer can be used, and hence faster laser etching, but the line will then have an irregular "mushroom" shape as shown in FIG. 6.

To demonstrate the ability to interconnect functioning IC's using the thin-film hybrid technology of the invention, a series of simple 1-level hybrid circuits were fabricated. Each hybrid circuit contained several 64K (8K×8) static RAM chips with initial dimensions 8.55 mm×9.6 mm×0.4 mm, with edges bevelled at 60° to the horizontal. Laser patterned 3 micron thick gold wires 100 microns wide on 200 micron centers connect all chip bond pads to the silicon substrate where they are routed to form a connector finger pattern for electrical testing. A conventional circuit would normally have several additional levels of thin film interconnect prefabricated in the silicon PC board instead of the single level of wiring used here. Much finer wiring pitches can be produced. A series of wires have been laser patterned on a 25 micron pitch down a 500 micron high die site; these 12 micron wires on 25 micron centers provided 1600 connections around the perimeter of a 1 cm square chip site, exhibiting the very high pinout capability of this interconnect technology.

A series of fully functional 2-chip hybrids were fabricated. The resistance of the interconnects was about 0.1 ohm for the chip to board (bevelled edge) segment. The thin film hybrid circuits exhibited excellent reliability, withstanding the thermal shock of an abrupt plunge into liquid nitrogen. The tensile strengths of the chip/substrate joints were typically measured to be 10 MPa (1500 psi). By attaching the hybrid circuits to a microchannel heat sink, it was possible to thermally cycle the joint 1 million times between room temperature and 110° C.; no degradation of the bond was observed after such stress cycling. Since there are no solder joints, only thin film interconnections, the circuits should have long term reliability.

Changes and modifications in the specifically described embodiments can be carried out without departing from the scope of the invention which is intended to be limited only by the scope of the appended claims.

I claim:

1. An interconnected hybrid integrated circuit structure, comprising:
   an interconnect substrate;
   one or more integrated circuit chips each having a back surface thereof bonded to a top surface of the substrate to form a hybrid integrated circuit structure;
   a ground surface formed on one or more lateral sides of each chip and extending across the chip-to-substrate bond into the adjoining substrate after bonding to form a smooth flush chip-to-substrate joint;
   electrical contacts on the chips;
   electrical contacts on the substrate;
   thin film metal wires formed on the ground surface on each chip to electrically connect the chip contacts to the substrate contacts.

2. The structure of claim 1 wherein the interconnect substrate is a silicon wafer.

3. The structure of claim 1 further comprising at least one raised mesa formed on the substrate for mounting the chips.

4. The structure of claim 1 wherein the chips are bonded to the substrate by a thin film joint.

5. The structure of claim 4 wherein the thin film joint is made of Au-Si alloy.

6. The structure of claim 4, wherein the thin film joint has a thickness of about 1–10 microns.

7. The structure of claim 1 wherein the ground surface is bevelled at an angle of about 60° from the horizontal line.

8. The structure of claim 1 wherein the ground surface is substantially vertical.

9. The structure of claim 1 wherein the ground surface is bevelled at a reentrant angle greater than 90° from the horizontal line.

10. The structure of claim 1 wherein the wires have an interconnect density with a pitch of less than 50 microns from center to center.

* * * * *